US006271603B1

(12) United States Patent
Kajita

(10) Patent No.: US 6,271,603 B1
(45) Date of Patent: Aug. 7, 2001

(54) FREQUENCY CONVERSION APPARATUS

(75) Inventor: Kazutoyo Kajita, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/349,857

(22) Filed: Jul. 8, 1999

(30) Foreign Application Priority Data

Jul. 16, 1998 (JP) .................................................. 10-202146

(51) Int. Cl.[7] .................................................. H02J 1/00
(52) U.S. Cl. ................................................ 307/43; 307/91
(58) Field of Search ....................... 307/43, 91; 361/800, 361/816, 818, 752; 174/35 R, 35 MS, 35 GC

(56) References Cited

U.S. PATENT DOCUMENTS

| | | | |
|---|---|---|---|
| 4,494,095 | * | 1/1985 | Noji et al. ................................. 334/85 |
| 4,569,000 | * | 2/1986 | Noji ...................................... 361/394 |
| 4,685,034 | * | 8/1987 | Tetsu et al. ............................ 361/424 |

FOREIGN PATENT DOCUMENTS

| | | |
|---|---|---|
| 58-16980 | 2/1983 | (JP) . |
| 9-232989 | * 5/1997 | (JP) .............................. H04B/01/26 |
| 10-150324 | 2/1998 | (JP) . |

* cited by examiner

Primary Examiner—Josie Ballato
Assistant Examiner—Sharon Polk
(74) Attorney, Agent, or Firm—Brinks Hofer Gilson & Lione

(57) ABSTRACT

In a frequency conversion apparatus, a first frequency conversion section is disposed in a first accommodating site, a second frequency conversion section is disposed in a second accommodating site, two shield plates are interposed between the first accommodating site and the second accommodating site, a first partitioned chamber is formed in the region surrounded by the shield plates, a first power supply line is disposed in the first partitioned chamber. Power is directly supplied from the first power supply line to the first frequency conversion section and the second frequency conversion section. With this arrangement, interference caused by the existence of two local oscillators is reduced without increasing the size of metal cases.

3 Claims, 2 Drawing Sheets

FREQUENCY CONVERSION APPARATUS

BACKGROUND OF THE INVENTION

1. Field of the Invention

The present invention relates to a frequency conversion apparatus preferably used in a receiver or a transmitter which executes frequency conversion at least two times.

2. Description of the Related Art

FIG. 3 is a block schematic diagram of a conventional frequency conversion apparatus for, for example, a television signal transmitter. A metal case 51 is formed in a rectangular frame shape with side plates 51a and 51b opposing each other in one direction and side plates 51c and 51d opposing each other in the other direction. Three partitioned chambers 51h, 51i and 51j are formed in parallel with each other by being separated from each other by shield plates 51e to 51g, which are interposed between the side plates 51a and 51b in parallel with the side plate 51c. Further, partitioned chambers 51m, 51n, 51o and 51p are formed by being separated from each other by shield plates 51k and 51l which are disposed in a cross state in the region surrounded by the shield plate 51g and the side plates 51a, 51b and 51d. As a result, the partitioned chamber 51h is located adjacent to the side plate 51c and the partitioned chambers 51o and 51p are located adjacent to the side plate 51d. A printed circuit board (not shown) is disposed in each of the partitioned chambers and a circuit is formed on the printed circuit board.

A first mixer 52 and a first local oscillator 53 are disposed in the partitioned chamber 51h, and external signals, for example, intermediate frequency signals Si for television broadcasting images (for example, 45.75 MHz), are supplied to the first mixer 52. The first local oscillator 53 supplies oscillation signals of about 1254 MHz to the first mixer 52. As a result, the first mixer 52 outputs first intermediate frequency signals of about 1300 MHz.

A first-stage first intermediate frequency amplifier 54 and a first stage band-pass filter 55 are disposed in the partitioned chamber 51i adjacent to the partitioned chamber 51h. The first intermediate frequency signals are supplied to the first-stage first intermediate frequency amplifier 54 and then sent to the next partitioned chamber 51j through the first stage band-pass filter 55.

A second-stage first intermediate frequency amplifier 56 and a second stage band-pass filter 57 are disposed in the partitioned chamber 51j. The first intermediate frequency signals are amplified with the second-stage first intermediate frequency amplifier 56 and further sent to the next partitioned chamber 51m through the second stage band-pass filter 57.

The partitioned chamber 51m is located adjacent to the partitioned chamber 51n and these partitioned chambers 51m and 51n are located adjacent to the partitioned chamber 51j. The partitioned chamber 51p is located adjacent to the partitioned chamber 51m and the partitioned chamber 51o is located adjacent to the partitioned chamber 51n. The partitioned chamber 51p and the partitioned chamber 51o are located adjacent to the side plate 51d.

A second mixer 58 is disposed in the partitioned chamber 51m, a second local oscillator 59 is disposed in the partitioned chamber 51o, an oscillation signal amplifier 60 is disposed in the partitioned chamber 51n, and a second intermediate frequency amplifier 61 is disposed in the partitioned chamber 51p.

The first intermediate frequency signals having passed through the second stage band-pass filter 57 are supplied to the second mixer 58.

In contrast, the oscillation signals from the second local oscillator 59 are amplified with the oscillation signal amplifier 60 and supplied to the second mixer 58. The oscillation frequency of the second local oscillator 59 changes from about 1348 MHz to about 2305 MHz. Therefore, second intermediate frequency signals so having any frequency from about 50 MHz to about 1000 MHz are output from the second mixer 58, amplified with the second intermediate frequency amplifier 61 and supplied to the outside from the partitioned chamber 51p. The second intermediate frequency signals So are transmitted to subscribers as cable television signals through a CATV cable (not shown).

A shield cover (not shown) is attached to the metal case 51 to integrally cover each of the partitioned chambers. The end surfaces of the shield plate 51e and the like are in contact with the shield cover when the shield cover is attached to the metal case 51, whereby the respective partitioned chambers are shielded from each other.

Power is supplied to the first mixer 52, the first local oscillator 53, and the like disposed in the respective partitioned chambers through conductive patterns 62 (shown by thick lines in FIG. 3) formed on the printed circuit boards in the partitioned chambers.

Incidentally, while the two local oscillators 53 and 59 oscillate with a different frequency, they output a multiplicity of higher harmonics at the same time.

On the other hand, while the shield cover is attached to the metal case 51, if small gaps exist between the end surfaces of the shield plate 51e, and the like of the metal case 51 and the shield cover, the higher harmonics from, for example, the first local oscillator 53 disposed in the partitioned chamber 51h, enter the partitioned chamber 51m, in which the second mixer 58 is disposed, through the gaps of the three shield plates 51e, 51f and 51g.

Further, the oscillation signals from the second local oscillator 59 are also supplied to the second mixer 58 and the higher harmonics are also supplied thereto.

For example, when the second local oscillator 59 oscillates with a frequency of 1904 MHz to set the frequency of the second intermediate frequency signals to about 604 MHz, if the second higher harmonics (frequency: 2508 MHz) of the first local oscillator 53 are supplied to the second mixer 58, beat signals having a frequency which is the difference therebetween (2508−1904=604 MHz) are generated by the second mixer 58. The signals act as interference signals to the second intermediate frequency signals of 604 MHz.

SUMMARY OF THE INVENTION

An object of the present invention is to reduce interference caused by the existence of two local oscillators without increasing the size of a metal case.

To solve the above problem a frequency conversion apparatus of the present invention comprises a first metal case having a first accommodating site and a second accommodating site; a first frequency conversion section disposed in the first accommodating site and having a first oscillator; a second frequency conversion section disposed in the second accommodating site and having a second oscillator; double shield plates standing between the first accommodating site and the second accommodating site; and a first power supply line disposed in a partitioned chamber surrounded by the double shield plates. Power is supplied from the first power supply line to the first frequency conversion section and the second frequency conversion section.

In a preferred embodiment, the frequency conversion apparatus of the present invention comprises a second metal case which is larger than the first metal case, wherein the first metal case is accommodated in the second metal case, a second power supply line is interposed between the first metal case and the second metal case, the first power supply line is connected to the second power supply line, and power is supplied from the first power supply line and the second power supply line to the first frequency conversion section and the second frequency conversion section.

In a preferred embodiment, the frequency conversion apparatus of the present invention comprises a first shield cover attached to the first metal case for covering the first accommodating site, the second accommodating site and the partitioned chamber, and a second shield cover attached to the second metal case for covering the first metal case.

DESCRIPTION OF THE PREFERRED EMBODIMENT

Figure 1:
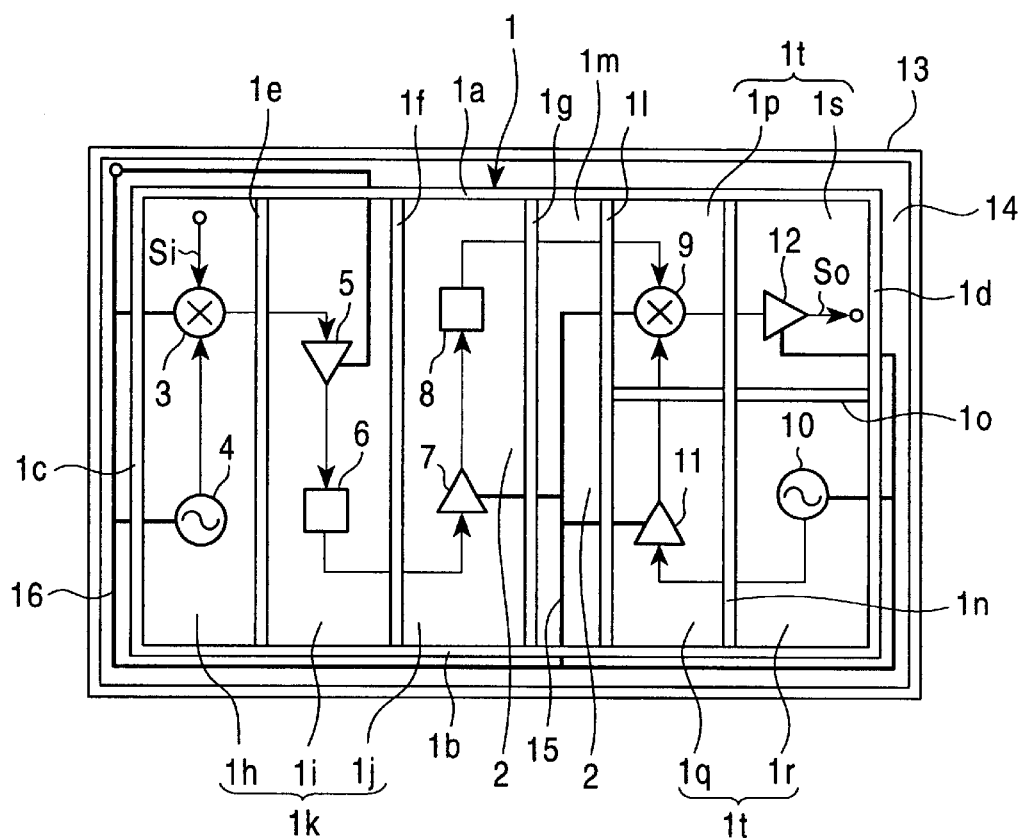
FIG. 1 is a block schematic diagram of a frequency conversion apparatus of the present invention.
Figure 2:
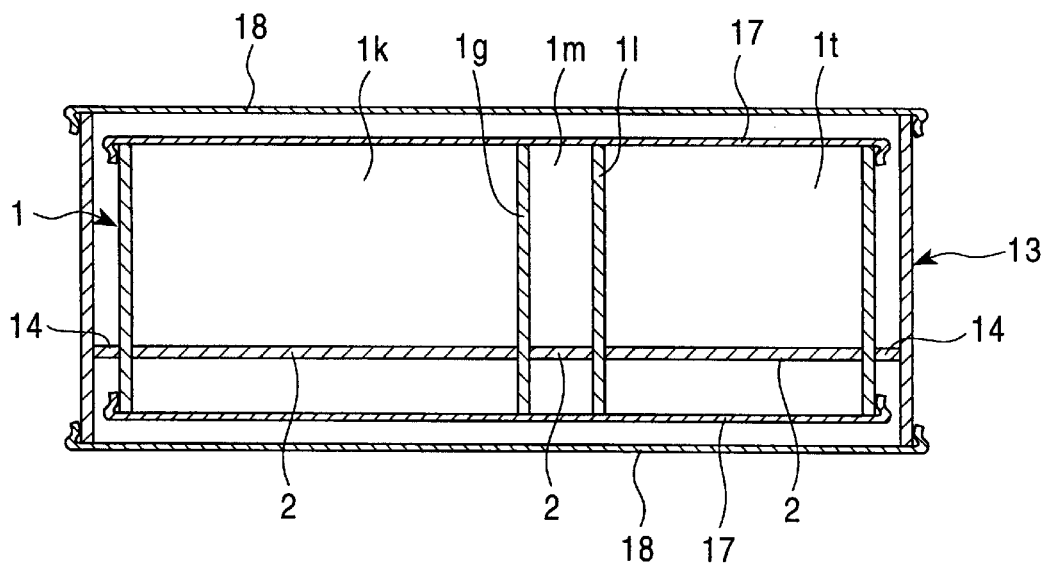
FIG. 2 is a sectional view of the main portion of the frequency conversion apparatus of the present invention.
Figure 3:
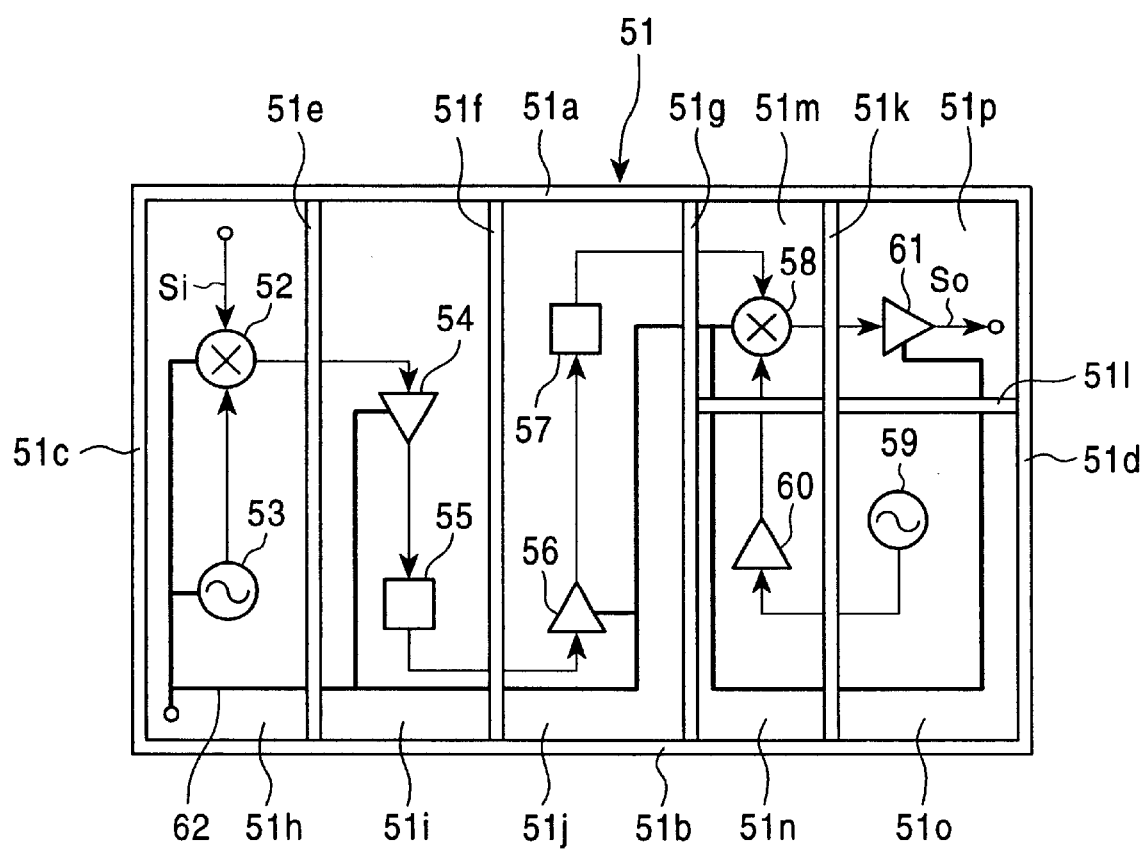
FIG. 3 is a block schematic diagram of a conventional frequency conversion apparatus.

A frequency conversion apparatus of the present invention will be described below with reference to FIG. 1 and FIG. 2. FIG. 1 is a block schematic diagram of the frequency conversion apparatus of the present invention and FIG. 2 is a sectional view of the main portion of the frequency conversion apparatus of the present invention. The frequency conversion apparatus is used in, for example, the transmitter of television signals. A first metal case 1 is formed in a rectangular frame shape with side plates 1a and 1b opposing each other in one direction and side plates 1c and 1d opposing each other in the other direction. Three partitioned chambers 1h, 1i and 1j are formed in parallel with each other by being separated from each other by shield plates 1e to 1g, which are interposed between the side plates 1a and 1b in parallel with the side plate 1c. A first accommodating site 1k is formed of these partitioned chambers 1h, 1i and 1j. Further, a shield plate 1l is disposed in parallel with the shield plate 1g, and a first partitioned chamber 1m is formed between the shield plate 1g and the shield plate 1l.

Partitioned chambers 1p, 1q, 1r and 1s are formed in a cross-in-square shape by shield plates 1n and 1o disposed in a cross state in the region surrounded by the shield plate 1l and the side plates 1a, 1b and 1d. A second accommodating site 1t is formed of partitioned chambers 1p, 1q, 1r and 1s. As a result, the partitioned chamber 1h is located adjacent to the side plate 1c, and the partitioned chambers 1r and 1s are located adjacent to the side plate 1d. Then, a printed circuit board 2 is disposed in each of the partitioned chambers, and a circuit block, which will be described later, is formed on each printed circuit board 2.

A first mixer 3 and a first local oscillator 4 are disposed in the partitioned chamber 1h, and external signals, for example, intermediate frequency signals Si for broadcasting television images (for example, 45.75 MHz), are supplied to the first mixer 3. The first local oscillator 4 supplies oscillation signals of about 1254 MHz to the first mixer 3. As a result, the first mixer 3 outputs first intermediate frequency signals of about 1300 MHz.

A first-stage first intermediate frequency amplifier 5 and a first stage band-pass filter 6 are disposed in the partitioned chamber 1i adjacent to the partitioned chamber 1h. The first intermediate frequency signals are supplied to the first-stage first intermediate frequency amplifier 5, output through the first stage band-pass filter 6, and sent to the next partitioned chamber 1j.

A second-stage first intermediate frequency amplifier 7 and a second stage band-pass filter 8 are disposed in the partitioned chamber 1j. The first intermediate frequency signals are amplified with the second-stage first intermediate frequency amplifier 7, output through the second stage band-pass filter 8, and sent to the partitioned chamber 1p of the second accommodating site 1t through the first partitioned chamber 1m.

As described above, the signals input to the first mixer 3 are subjected to frequency conversion and are made into the first intermediate frequency signals and then subjected to a predetermined processing, such as amplification and the like. The first mixer 3, the first local oscillator 4, the first-stage first intermediate frequency amplifier 5, the first stage band-pass filter 6, the second-stage first intermediate frequency amplifier 7 and the second stage band-pass filter 8 constitute a first frequency conversion section and are disposed in the partitioned chambers 1h, 1i and 1j of the first accommodating site 1k.

In the second accommodating site 1t, the partitioned chamber 1p is located adjacent to the partitioned chamber 1q, the partitioned chamber 1r is located adjacent to the partitioned chamber 1s, the partitioned chamber 1p is located adjacent to the partitioned chamber 1s, and the partitioned chamber 1q is located adjacent to the partitioned chamber 1r. The partitioned chamber 1p and the partitioned chamber 1q are located adjacent to the first partitioned chamber 1m. Further, the partitioned chamber 1r and the partitioned chamber 1s are located adjacent to the side plate 1d.

In addition, the first accommodating site 1k is separated from the second accommodating site 1t by the two shield plates 1g and 1l.

A second mixer 9 is disposed in the partitioned chamber 1p, a second local oscillator 10 is disposed in the partitioned chamber 1r, a local oscillation signal amplifier 11 is disposed in the partitioned chamber 1q, and a second intermediate frequency amplifier 12 is disposed in the partitioned chamber 1s.

Then, the first intermediate frequency signals having passed through the second stage band-pass filter 8 and the first partitioned chamber 1m are supplied to the second mixer 9.

The oscillation signals from the second local oscillator 10 are amplified with the local oscillation signal amplifier 11 and supplied to the second mixer 9. The oscillation frequency of the second local oscillator 10 is changed from about 1348 MHz to about 2305 MHz. Therefore, second intermediate frequency signals So having any frequency from about 50 MHz to about 1000 MHz are output from the second mixer 9, amplified with a second intermediate frequency amplifier 12, and supplied to the outside from the partitioned chamber is. The second intermediate frequency signals so are transmitted to subscribers through a CATV cable (not shown) as cable television signals.

As described above, the first intermediate frequency signals, having been supplied to the second mixer 9, are subjected to frequency conversion and are made into the second intermediate frequency signals and then subjected to predetermined processing, such as amplification and the like. The second mixer 9, the second local oscillator 10, the local oscillation signal amplifier 11, and the second intermediate frequency amplifier 12 constitute a second frequency conversion section and are disposed in the partitioned chambers 1p, 1r, 1q of the second accommodating site 1t.

The first metal case 1 is accommodated in a second metal case 13 which is larger than the first metal case 1. A printed circuit board 14 is also interposed between the first metal case 1 and the second metal case 13. Therefore, the printed circuit board 2 disposed in the first metal case 1 can be integrated with the printed circuit board 14 interposed between the first metal case 1 and the second metal case 13.

A first power supply line 15, composed of a conductive pattern or the like, is formed on the printed circuit board 2 disposed in the first partitioned chamber 1m in the first metal case 1. A second power supply line 16, composed of a conductive pattern or the like, is formed on the printed circuit board 14 interposed between the first metal case 1 and the second metal case 13, and the first power supply line 15 is connected to the second power supply line 16. Power is directly supplied from these power supply lines 15 and 16 to the first mixer 3, the first local oscillator 4, the first stage first intermediate frequency amplifier 5, the second stage intermediate frequency amplifier 7, the second mixer 9, the second local oscillator 10, the oscillation signal amplifier 11, and the second intermediate frequency amplifier 12 which are disposed in the partitioned chambers. Therefore, power supply lines which are connected to each other need not be disposed in the respective partitioned chambers, and further the lengths of the power supply lines disposed in the respective partitioned chambers are shortened, whereby the areas of the respective partitioned chambers can be reduced. As a result, the size of the first metal case 1 can be made small, and thus the overall body including the second metal case 13 disposed outside the first metal case 1 can be made approximately as large as the conventional metal case 51.

As shown in FIG. 2, first shield covers 17, which integrally covers the first accommodating site 1k, the second accommodating site 1t, and the partitioned chamber 1m, are attached to the first metal case 1. Further, second shield covers 18 are attached to the second metal case 13 so as to cover the first metal case 1. With this arrangement, the first local oscillator 4 and the second local oscillator 10 can be doubly shielded with the first metal case 1 and the first shield cover 17 which covers it, and with the second metal case 13 and the second shield cover 18 which covers it. The level of oscillation signals which leak to the outside is thereby greatly lowered and no interference is caused to external equipment.

In the frequency conversion apparatus of the present invention, the first accommodating site 1k is separated from the second accommodating site 1t by the two shield plates 1g a 1l. Therefore, it is difficult for the higher harmonics radiated from the first local oscillator 4 in the first accommodating site 1k to enter the partitioned chamber 1p of the second accommodating site 1t, whereby it is difficult for interference signals to be generated in the second mixer 9.

Further, since the partitioned chamber 1h, in which the first local oscillator 4 is disposed, is located adjacent to the side plate 1c, the partitioned chamber 1h is separated from the second accommodating site 1t. As a result, even if the higher harmonics from the first local oscillator 4 enter the partitioned chamber 1p of the second accommodating site 1t in which the second mixer 9 is disposed, the level of the higher harmonics is low, whereby it is difficult for interference signals to be generated in the second mixer 9.

While the frequency conversion apparatus which is used in the television signal transmitter is exemplified in the above description, the same effect can be obtained even if it is applied to, for example, a frequency conversion apparatus used as the tuner of a television signal receiver.

As described above, in the frequency conversion apparatus of the present invention, the first frequency converting section is disposed in the first accommodating site; the second frequency converting section is disposed in the second accommodating site; double shield plates stand between the first accommodating site and the second accommodating site; the first power supply line is disposed in the partitioned chamber surrounded by the double shield plates; and power is supplied from the first power supply line to the first frequency converting section and the second frequency converting section. Accordingly, it is not necessary to dispose power supply lines which are connected to each other to each partitioned chamber of the accommodating sites. In addition, the length of the power supply line in each partitioned chamber is shortened, whereby the area of each partitioned chamber can be reduced. As a result, the size of the first metal case can be reduced.

Further, in the frequency conversion apparatus of the present invention, since the first accommodating site is separated from the second accommodating site by the double shield plates, it is difficult for the higher harmonics emitted from the first local oscillator in the first accommodating site to enter the second accommodating site, and thus the generation of interference signals in the second mixer disposed in the second accommodating site is made difficult.

In the frequency conversion apparatus of the present invention, the second metal case which is larger than the first metal case is provided. The first metal case is accommodated in the second metal case, and the second power supply line is interposed between the first metal case and the second metal case. The first power supply line is connected to the second power supply line, and power is supplied from the first power supply line and the second power supply line to the first frequency conversion section and the second frequency conversion section. As a result, the areas occupied by the respective partitioned chambers in the first metal case can be further reduced, whereby the first accommodating site and the second accommodating site can be shielded without increasing size of the whole body including the second metal case.

Further, the frequency conversion apparatus of the present invention is provided with the first shield cover, which is attached to the first metal case and covers the first accommodating site, the second accommodating site and the first partitioned chamber, and the second shied cover, which is attached to the second metal case and covers the first metal case. The first oscillator and the second oscillator can be thereby doubly shielded by the first metal case and the first shield cover which covers it and the second metal case and the second shield cover which covers it. With this arrangement, the level of oscillation signals which leak to the outside is greatly lowered and no interference is caused to external equipment by the oscillation signals.

What is claimed is:
1. A frequency conversion apparatus comprising:
   a first metal case having a first accommodating site and a second accommodating site;
   a first frequency conversion section disposed in the first accommodating site and having a first oscillator;

a second frequency conversion section disposed in the second accommodating site and having a second oscillator;

double shield plates standing between the first accommodating site and the second accommodating site; and a first power supply line disposed in a partitioned chamber surrounded by said double shield plates, wherein power is supplied from said first power supply line to said first frequency conversion section and said second frequency conversion section.

2. A frequency conversion apparatus according to claim 1, further comprising a second metal case which is larger than said first metal case, wherein said first metal case is accommodated in said second metal case, a second power supply line is interposed between said first metal case and said second metal case, said first power supply line is connected to said second power supply line, and power is supplied from said first power supply line and said second power supply line to said first frequency conversion section and said second frequency conversion section.

3. A frequency conversion apparatus according to claim 2, further comprising a first shield cover attached to said first metal case for covering said first accommodating site, said second accommodating site, and said partitioned chamber, and a second shield cover attached to said second metal case for covering said first metal case.

* * * * *